United States Patent
Soejima et al.

(10) Patent No.: US 7,652,375 B2
(45) Date of Patent: Jan. 26, 2010

(54) SEMICONDUCTOR DEVICE AND METHOD OF MANUFACTURING THE SAME

(75) Inventors: Koji Soejima, Kanagawa (JP); Yoichiro Kurita, Kanagawa (JP); Masaya Kawano, Kanagawa (JP); Shintaro Yamamichi, Tokyo (JP); Katsumi Kikuchi, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 366 days.

(21) Appl. No.: 11/790,155

(22) Filed: Apr. 24, 2007

(65) Prior Publication Data
US 2008/0136020 A1    Jun. 12, 2008

(30) Foreign Application Priority Data
Apr. 26, 2006   (JP)   ............................. 2006-121575

(51) Int. Cl.
*H01L 23/48*   (2006.01)
*H01L 23/52*   (2006.01)
(52) U.S. Cl. .................. 257/737; 257/778; 257/779; 257/751; 257/E23.021
(58) Field of Classification Search .................. 257/737, 257/778, 779, 751, E23.021
See application file for complete search history.

(56) References Cited

U.S. PATENT DOCUMENTS

| | | | |
|---|---|---|---|
| 7,202,569 B2 * | 4/2007 | Tomono | ..................... 257/772 |
| 2001/0044197 A1 * | 11/2001 | Heinen et al. | ............... 438/612 |
| 2002/0074637 A1 * | 6/2002 | McFarland | .................. 257/686 |
| 2002/0180027 A1 * | 12/2002 | Yamaguchi et al. | ......... 257/700 |
| 2004/0113254 A1 * | 6/2004 | Karnezos | ..................... 257/686 |
| 2004/0140571 A1 * | 7/2004 | Tomura et al. | .............. 257/778 |
| 2005/0006747 A1 * | 1/2005 | Watanabe et al. | ........... 257/688 |
| 2008/0110665 A1 * | 5/2008 | Satoh et al. | .................. 174/254 |

FOREIGN PATENT DOCUMENTS

| | | |
|---|---|---|
| JP | 11-345933 | 12/1999 |
| JP | 2001-217388 | 8/2001 |
| JP | 6-140455 | 5/2007 |

* cited by examiner

*Primary Examiner*—Nitin Parekh
(74) *Attorney, Agent, or Firm*—Young & Thompson

(57) ABSTRACT

A first electronic circuit component and a second electronic circuit component are electrically connected to an electro-conductive member via a first solder and a second solder, respectively. The electro-conductive member is formed in a resin film. The electro-conductive member is configured as containing a second diffusion barrier metal film. The second diffusion barrier metal film prevents diffusion of the second solder. Between the electro-conductive member and the first solder, a first diffusion barrier metal film is provided. The first diffusion barrier metal film prevents diffusion of the first solder. On the first surface of the resin film and on the electro-conductive member, an adhesive metal film is formed so as to contact with the resin film and the electro-conductive member. The adhesive metal film has stronger adhesiveness to the resin film than either of those of the first solder and the first diffusion barrier metal film.

9 Claims, 16 Drawing Sheets

SEMICONDUCTOR DEVICE AND METHOD OF MANUFACTURING THE SAME

This application is based on Japanese patent application No. 2006-121575 the content of which is incorporated hereinto by reference.

BACKGROUND

1. Technical Field

The present invention relates to a semiconductor device and a method of manufacturing the same, and in particular to a semiconductor device having a solder bump electrode and a method of manufacturing the same.

2. Related Art

One example of conventionally-known semiconductor devices can be found in Japanese Laid-Open patent publication No. H6-140465 (patent document 1). The semiconductor device described in this document includes an insulating base material typically composed of a polyimide film, having, as being mounted on both surfaces thereof, an IC chip having solder bump electrodes, and a circuit wiring board having solder bump electrodes. A Cu film is brought into close contact with the insulating base material. Prior art documents relevant to the present invention other than the patent document 1 includes Japanese Laid-Open patent publications No. H11-345933 (patent document 2) and No. 2001-217388 (patent document 3).

SUMMARY OF THE INVENTION

However in the semiconductor device described in the patent document 1, a solder material composing the solder bump electrodes diffuses through the Cu film, reaches the interface between the insulating base material and the Cu film, and consequently the insulating base material and the Cu film become more likely to separate from each other.

According to the present invention, there is provided a semiconductor device including: an insulating film; an electro-conductive member provided in the insulating film; a first electronic circuit component provided on a first surface side of the insulating film, and electrically connected to the electro-conductive member via a first solder; a second electronic circuit component provided on a second surface side, which is opposite to the first surface side, of the insulating film, and electrically connected to the electro-conductive member via a second solder; a first diffusion barrier metal film provided between the electro-conductive member and the first solder, and preventing diffusion of the first solder; a second diffusion barrier metal film constituting at least a part of the electro-conductive member, and preventing diffusion of the second solder; and an adhesive metal film provided on the first surface of the insulating film and on the electro-conductive member as being brought into contact with the insulating film and the electro-conductive member, and having adhesiveness to the insulating film stronger than the adhesiveness of the first solder and the adhesiveness of the first diffusion barrier metal film.

In this semiconductor device, the first diffusion barrier metal film is provided between the adhesive metal film and the first solder, and the second diffusion barrier metal film is provided between the adhesive metal film and the second solder. By contribution of these diffusion barrier metal films, the solder can be prevented from reaching the interface between the insulating film and the adhesive metal film. As a consequence, a semiconductor device less likely to cause separation between the insulating film and the adhesive metal film can be realized.

According to the present invention, there is also provided a method of manufacturing a semiconductor device including: forming, in an insulating film, an electro-conductive member, at least a part of which is constituted by a second diffusion barrier metal film; forming, on the insulating film and on the electro-conductive member, an adhesive metal film so that the adhesive metal film is brought into contact with the insulating film and the electro-conductive member; forming, on the adhesive metal film, a first diffusion barrier metal film; placing, on the first diffusion barrier metal film, a first electronic circuit component via a first solder so that the first electronic circuit component is electrically connected to the electro-conductive member; and placing, on a side of the insulating film opposite to the first electronic circuit component, a second electronic circuit component via a second solder so that the second electronic circuit component is electrically connected to the electro-conductive member, wherein the adhesive metal film has adhesiveness to the insulating film stronger than the adhesiveness of the first solder and the adhesiveness of the first diffusion barrier metal film, and the first and second diffusion barrier metal films prevent diffusion of the first and second solders, respectively.

This method includes a step of forming an electro-conductive member configured in at least a part thereof by using a second diffusion barrier metal film, and a step of forming the first diffusion barrier metal film on the adhesive metal film. As a consequence, the manufactured semiconductor device has the first diffusion barrier metal film provided between the adhesive metal film and the first solder, and has also the second diffusion barrier metal film provided between the adhesive metal film and the second solder. By contribution of these diffusion barrier metal films, the solder can be prevented from reaching the interface between the insulating film and the adhesive metal film. As a consequence, a semiconductor device less likely to cause separation between the insulating film and the adhesive metal film can be realized.

According to the present invention, a semiconductor device less causative of separation between the insulating film and the adhesive metal film, and a method of manufacturing such semiconductor device, can be realized.

BRIEF DESCRIPTION OF THE DRAWINGS

The above and other objects, advantages and features of the present invention will be more apparent from the following description taken in conjunction with the AC companying drawings, in which.

DETAILED DESCRIPTION

Figure 1:
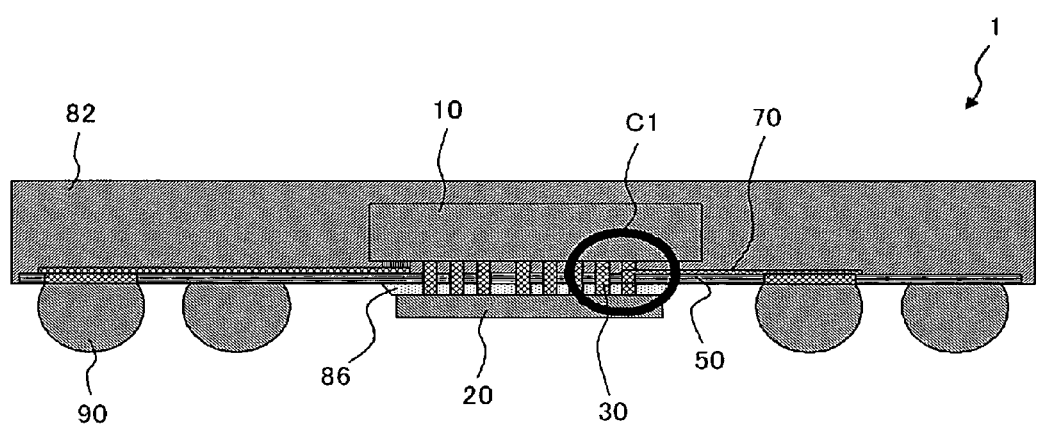
FIG. 1 is a sectional view showing an embodiment of the semiconductor device of the present invention.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will detail the embodiments of the semiconductor device and the method of manufacturing the same according to the present invention, referring to the attached drawings. It is to be noted that, in the explanation of the drawings, any similar components will be given with the same reference numerals, so as to avoid repetitive explanation.

Figure 2:
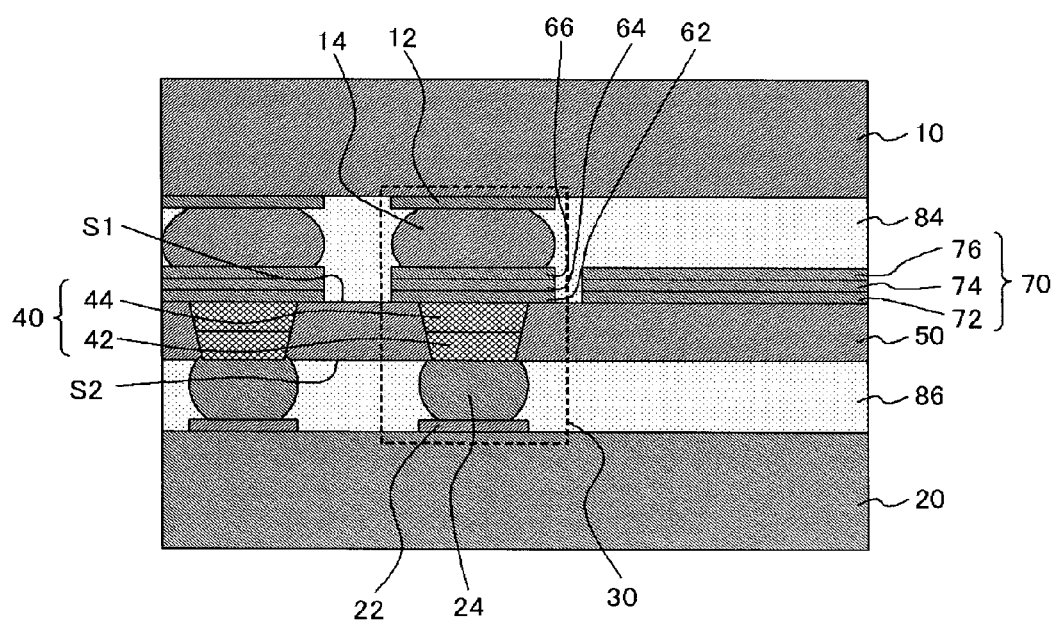
FIG. 2 is a sectional view showing a part of the semiconductor device shown in FIG. 1.
Figure 3:
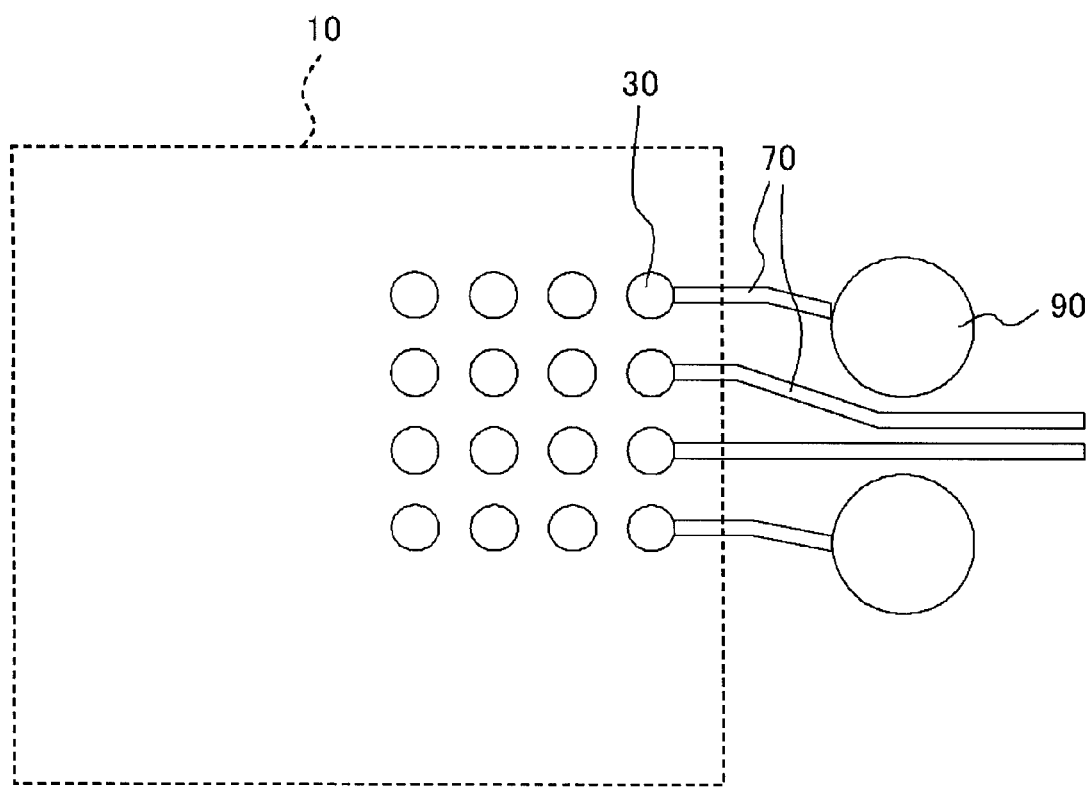
FIG. 3 is a plan view showing a part of the semiconductor device shown in FIG. 1.

FIG. 1 is a sectional view showing an embodiment of the semiconductor device according to the present invention. FIG. 2 is a sectional view showing a part of the semiconductor device. This drawing shows a portion and around surrounded by a circle C1 shown in FIG. 1. FIG. 3 is a plan view showing a part of the semiconductor device. The semiconductor device 1 has a semiconductor chip 10 (first electronic circuit component), and a semiconductor chip 20 (second electronic circuit component). The semiconductor chip 10 and the semiconductor chip 20 are, for instance, LSI chips. The semiconductor chip 10 is covered with a molding resin 82. Connective portions 30 of the semiconductor chip 10 and the semiconductor chip 20 are electrically connected to external electrode terminals 90 of the semiconductor device 1, by interconnects 70. The external electrode terminal 90 is, for instance, a BGA (ball grid array).

A configuration of the connective portions 30 will be explained below, referring to FIG. 2. In a resin film 50 (insulating film), electro-conductive members 40 are formed. The thickness of the resin film 50 is, for instance, 5 to 10 μm. The thickness is preferably 20 μm or below. The resin film 50 can be exemplified by an epoxy resin film, BT resin film, polyimide resin film, and so forth.

Each electro-conductive member 40 is composed of a Cu film 42 and a Ni film 44 (second diffusion barrier metal film). The Ni film 44 prevents diffusion of a solder 24 described later. As is obvious from the drawing, the Ni film 44 in this embodiment exposes to a surface Si (first surface) of the resin film 50, and the Cu film 42 exposes to a surface S2 (second surface) of the resin film 50. In other words, the surficial layer of the electro-conductive member 40 on the surface S1 side is composed of the Ni film 44, and the surficial layer of the electro-conductive member 40 on the surface S2 side is composed of the Cu film 42. The thickness of the Cu film 42 is, for instance, 2 to 5 μm. The thickness of the Ni film 44 is, for instance, 3 to 5 μm.

The semiconductor chip 10 and the semiconductor chip 20 are provided on the surface Si side and on the surface S2 side of the resin film 50, respectively. The semiconductor chip 10 and the semiconductor chip 20 are electrically connected to the electro-conductive members 40, via solders 14 (first solders) and solders 24 (second solders), respectively.

Between the electro-conductive members 40 and the solders 14, a Ni film 66 (first diffusion barrier metal film) is provided. The Ni film 66 prevents diffusion of the solders 14. On the surface S1 of the resin film 50 and on the electro-conductive members 40, a Ti film 62 (adhesive metal film) is formed so as to contact with the resin film 50 and the electro-conductive members 40. The Ti film 62 has adhesiveness to the resin film 50 stronger than either of those of the solders 14 and the Ni film 66. As this sort of adhesive metal film, a metal film having adhesiveness to the resin film 50 stronger than that of the Cu film is used. Degree of the adhesiveness herein can be measured by peeling test such as tape peeling. Because the Ni film 44 is provided in the surficial layer of the electro-conductive member 40 on the surface Si side, the Ni film 44 and the Ti film 62 are brought into contact with each other. In this embodiment, a Cu film 64 is provided between the Ti film 62 and the Ni film 66.

Each solder 14 described in the above has one end connected to an electrode 12 of the semiconductor chip 10, and the other end connected to the Ni film 66. Each solder 24 has one end connected to an electrode 22 of the semiconductor chip 20, and the other end connected to the Cu film 42 of the electro-conductive member 40. As is obvious from FIG. 2, each solder 24 is brought into contact with the electro-conductive member 40, on the surface S2 of the resin film 50. In other words, in the semiconductor device 1, the electro-conductive member 40 and the solder 24 are connected to each other without placing a pad or the like therebetween.

On the surface S1 of the resin film 50, interconnects 70 are formed. The interconnects 70 contain a material composing the adhesive metal film (Ti in this embodiment). More specifically, the interconnects 70 are composed of a Ti film 72, a Cu film 74 and a Ni film 76. These Ti film 72, Cu film 74 and Ni film 76 are stacked in this order on the surface S1. In other words, the interconnects 70 have a stacked structure same as the stacked structure composed of the Ti film 62, the Cu film 64 and the Ni film 66. The gap between the semiconductor chip 10 and the resin film 50 is filled with an underfill resin 84. Similarly, the gap between the semiconductor chip 20 and the resin film 50 is filled with an underfill resin 86.

As has been described in the above, in the semiconductor device 1, the semiconductor chip 10 and the semiconductor chip 20 are connected through their respective electrodes 12, 22, while opposing the circuit-forming surfaces with each other. Between these semiconductor chips 10, 20, there is the resin film 50 holding the interconnects 70, wherein the resin film 50 has, as being formed therein, holes used for connection. In the holes, the electro-conductive members 40 are formed. On a virtual line connecting the electrode 12 and the electrode 22, the solder 14, the Ni film 66, the Cu film 64, the Ti film 62, the electro-conductive member 40 and the solder 24 are provided as viewed from the electrode 12 side.

In this embodiment, an Au film (first Au film) in contact with the solder 14 may be provided on the Ni film 66. It is also allowable to provide an Au film (second Au film) in contact with the solder 24, on the Cu film 42 of the electro-conductive members 40.

Figure 4A:
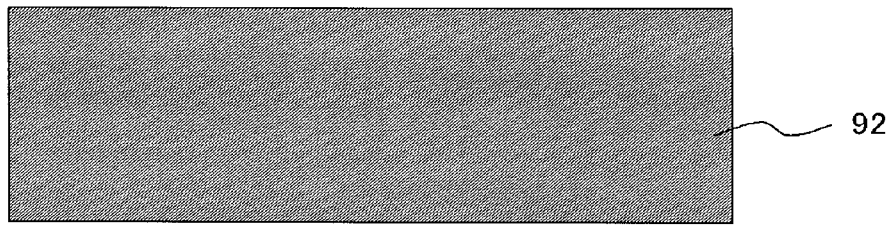
FIGS. 4A to 4C are drawings showing process steps of an embodiment of the method of manufacturing a semiconductor device of the present invention.
Figure 4B:
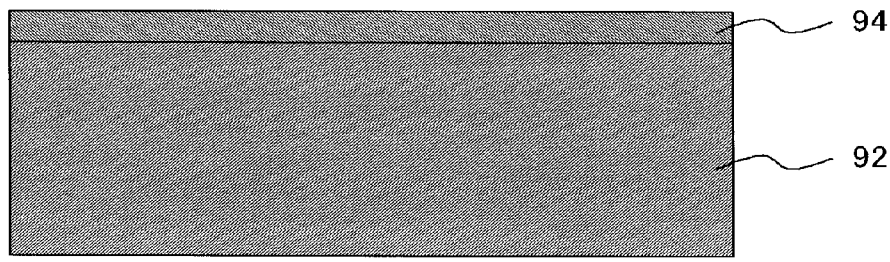
Figure 4C:
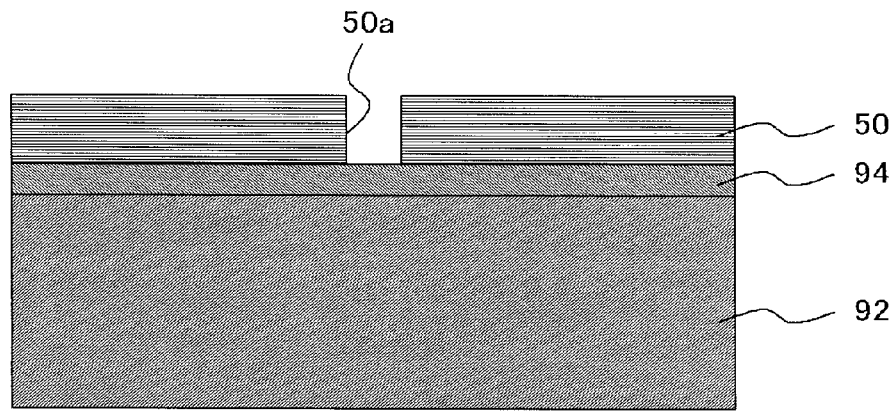
Figure 5A:
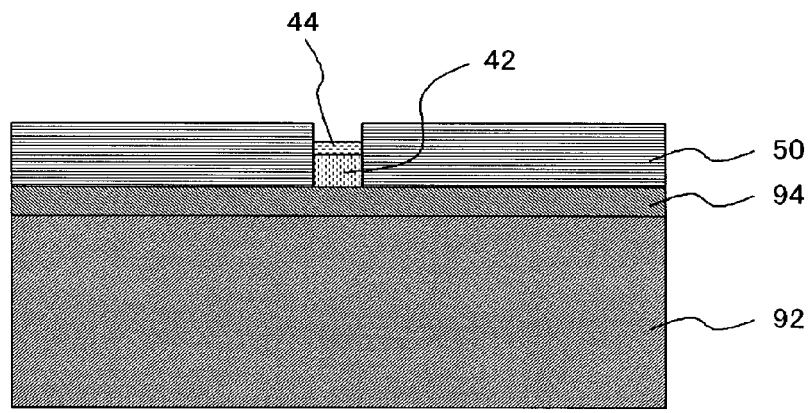
FIGS. 5A to 5C are drawings showing process steps of an embodiment of the method of manufacturing a semiconductor device of the present invention.
Figure 5B:
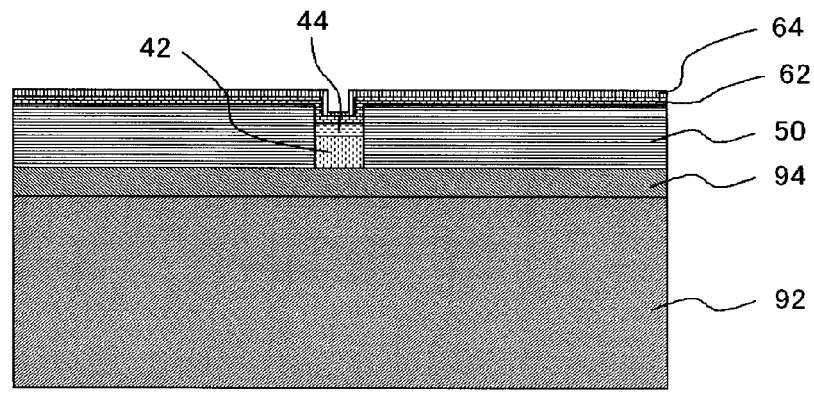
Figure 5C:
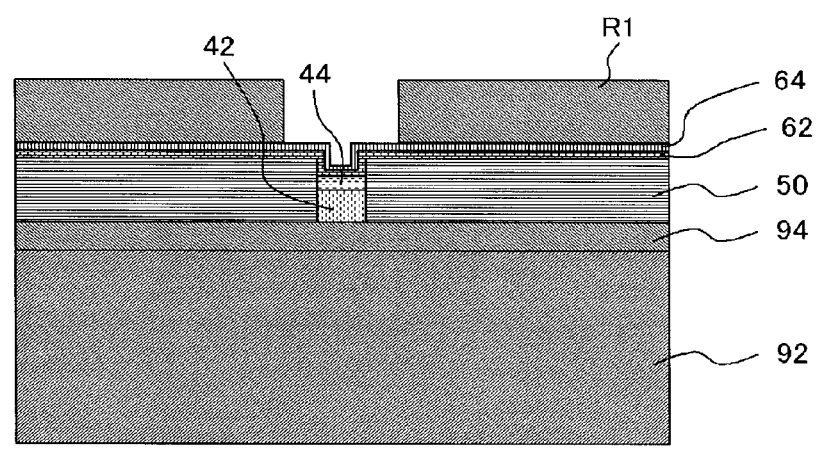
Figure 6A:
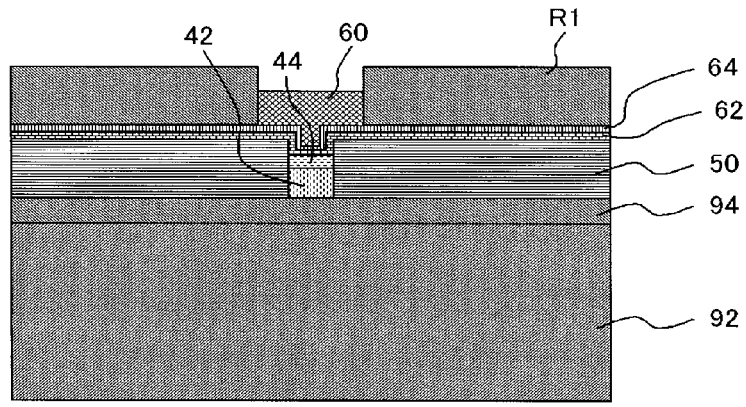
FIGS. 6A to 6C are drawings showing process steps of an embodiment of the method of manufacturing a semiconductor device of the present invention.
Figure 6B:
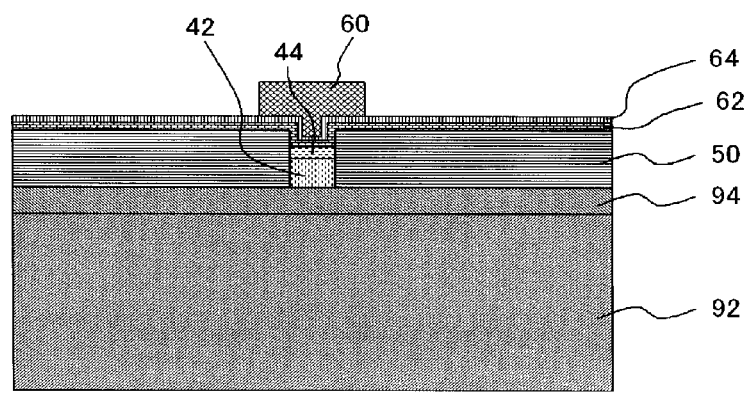
Figure 6C:
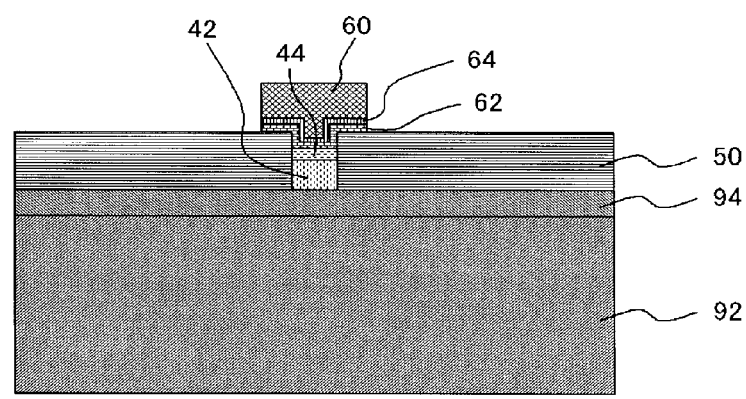
Figure 7A:
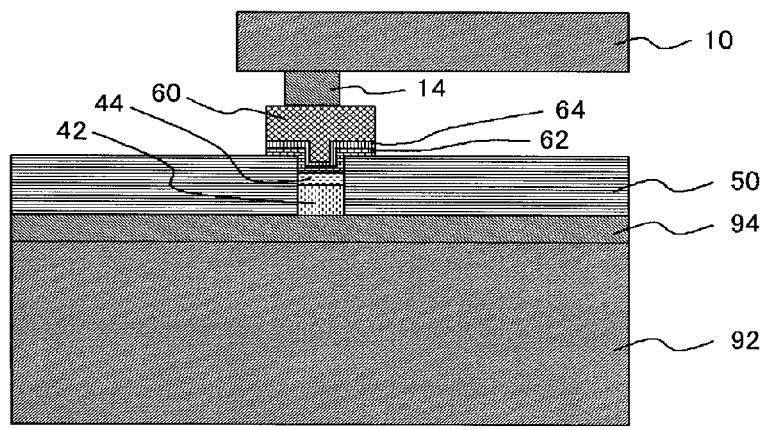
FIGS. 7A to 7C are drawings showing process steps of an embodiment of the method of manufacturing a semiconductor device of the present invention.
Figure 7B:
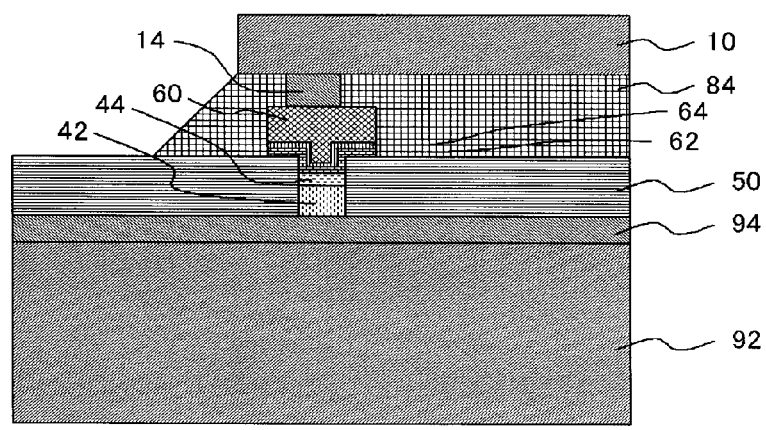
Figure 7C:
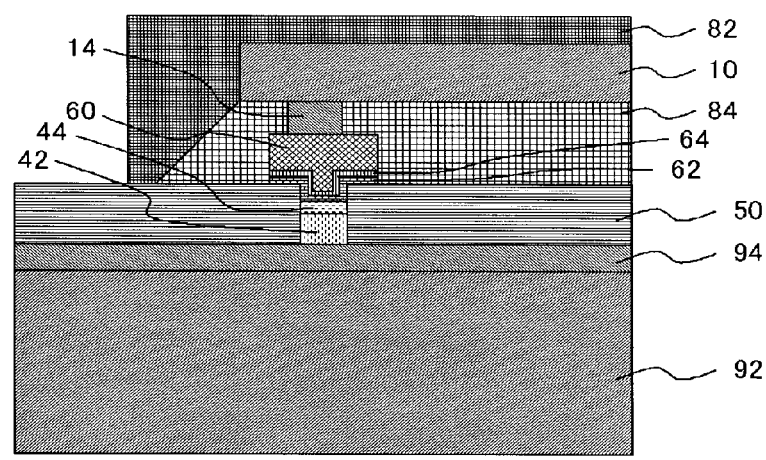
Figure 8A:
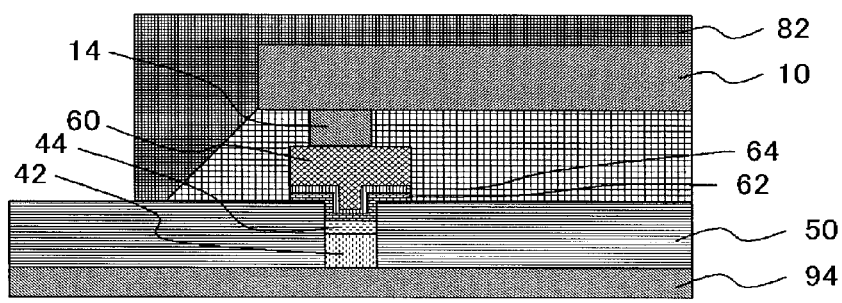
FIGS. 8A and 8B are drawings showing process steps of an embodiment of the method of manufacturing a semiconductor device of the present invention.
Figure 8B:
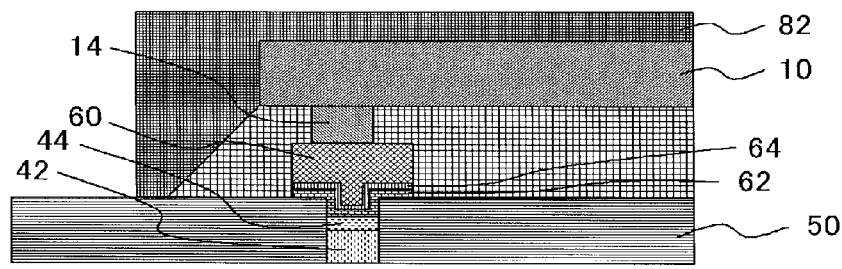
Figure 9A:
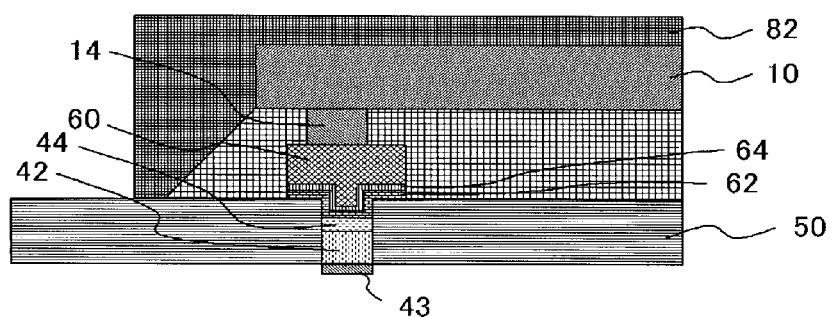
FIGS. 9A and 9B are drawings showing process steps of an embodiment of the method of manufacturing a semiconductor device of the present invention.
Figure 9B:
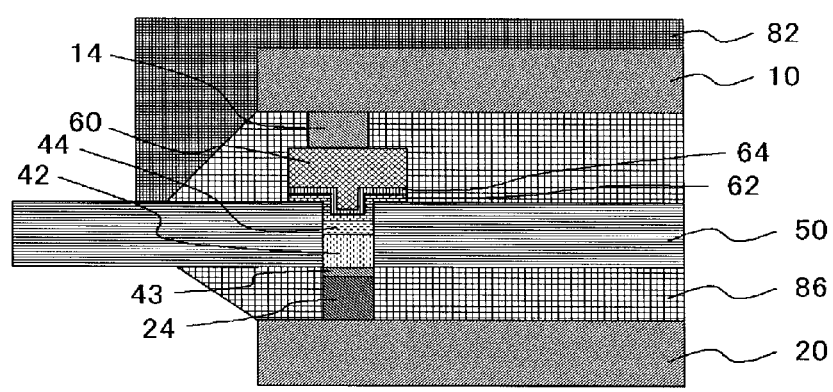

An exemplary method of manufacturing the semiconductor device 1 will be described as an embodiment of the method of manufacturing a semiconductor device of the present invention, referring to FIG. 4A to 9B. This method includes steps (a) to (g) below:

(a) forming the resin film 50 on a supporting substrate, prior to forming the electro-conductive members 40 (FIG. 4A to FIG. 4C);

(b) forming the electro-conductive members 40 in the resin film 50 (FIG. 5A);

(c) forming the Ti film 62 on the resin film 50 and on the electro-conductive members 40, so as to contact with the resin film 50 and the electro-conductive members 40 (FIG. 5B to FIG. 5C);

(d) forming the Ni film 66 on the Ti film 62 (FIG. 6A to FIG. 6C);

(e) placing the semiconductor chip 10 on the Ni film 66 via the solder 14, so that the semiconductor chip 10 is electrically connected to the electro-conductive members 40 (FIG. 7A to FIG. 7C);

(f) removing the supporting substrate, posterior to the placing the semiconductor chip 10, and prior to the placing the semiconductor chip 20 (FIG. 8A to FIG. 8B); and (g) placing the semiconductor chip 20 on a side of the resin film 50 opposite to the semiconductor chip 10 via the solder 24, so that the semiconductor chip 20 is electrically connected to the electro-conductive members 40 (FIG. 9A to FIG. 9B).

In more detail, first a supporting substrate 92 such as a silicon substrate or the like is prepared (FIG. 4A). On the supporting substrate 92, a Cu film having a thickness of 0.2 μm or around is formed by sputtering as a plating seed layer 94 (FIG. 4B). Photo-sensitive polyimide is coated on the plating seed layer 94, dried, rinsed on the edge, subjected to light exposure and development, so as to form a predetermined pattern. The resin film 50 having holes 50a is thus formed (FIG. 4C).

Next, the Cu film 42 having the thickness of 3 μm or around and the Ni film 44 having the thickness of 3 μm or around are formed by electroless plating in the holes 50a (FIG. 5A). After an oxide film on the surface of the Ni film 44 is removed by Ar plasma etching, the Ti film 62 and the Cu film 64 are formed as a sputtered seed film (FIG. 5B). A photoresist R1 is coated on the Cu film 64, dried, and subjected to light exposure and development so as to form predetermined openings (FIG. 5C).

Next, a Cu film having the thickness of 3 μm or around, a Ni film having the thickness of 6 μm or around, and a Au film having the thickness of 1 μm or around are sequentially formed in the openings of the photoresist R1 by electroless plating (FIG. 6A). The Cu film, the Ni film and the Au film will collectively be referred to as an interconnect film 60, hereinafter. Next, the photoresist R1 is removed by solvent cleaning (FIG. 6B). The Ti film 62 and the Cu film 64 are then removed by wet etching selectively in portions having no interconnect film 60 formed thereon (FIG. 6C).

Next, each of the electrodes (not shown) of the semiconductor chip 10 is connected to the interconnect film 60 via the solder 14 (FIG. 7A). The gap between the semiconductor chip 10 and the resin film 50 is filled with the underfill resin 84 (FIG. 7B). The molding resin 82 is formed so as to cover the semiconductor chip 10 (FIG. 7C).

Next, the supporting substrate 92 is removed (FIG. 8A). The supporting substrate 92 can be removed, for instance, by using grinding, chemical-mechanical polishing, etching or the like. Next, the plating seed layer 94 is removed by wet etching (FIG. 8B). On the Cu film 42 exposed as a result of removal of the supporting substrate 92 and the plating seed layer 94, a Au film 43 is formed by electroless substitutive Au plating (FIG. 9A). Each of the electrodes (not shown) of the semiconductor chip 20 is connected to the Au film 43 via the solder 24. The gap between the semiconductor chip 20 and the resin film 50 is filled with the underfill resin 86 (FIG. 9B). The semiconductor device 1 shown in FIG. 1 is obtained in this way.

Effects of this embodiment will be explained. In this embodiment, the Ni film 66 is provided between the Ti film 62 and the solders 14, and the Ni film 44 is provided between the Ti film 62 and the solders 24. By contribution of the Ni film 66, the material composing the solders 14 can be prevented from reaching the interface between the resin film 50 and the Ti film 62. Similarly, by contribution of the Ni film 44, the material composing the solders 24 can be prevented from reaching the above-described interface. As a consequence, a semiconductor device less likely to cause separation between the resin film 50 and the Ti film 62, and a method of manufacturing the same, can be realized.

In contrast, the semiconductor device described in the patent document 1 has no Ni film or the like as the diffusion barrier metal film, so that the solder is more likely to diffuse through the Cu film, and to reach the interface between the Cu film and the insulating base material. Once the solder reaches the interface, adhesiveness between the insulating base material and the Cu film degrades, and thereby difference in stress between the insulating base material and the Cu film will result in separation at the interface between the insulating base material and the Cu film. What is worse, the separation described above further induces separation at the interface between the metal film in the insulating base material and the Cu film. This is because the separation between the insulating base material and the Cu film induces concentration of stress at the interface between the above-described metal film and the Cu film.

The semiconductor device described in the patent document 2 has provided therein a diffusion barrier metal film composed of Ti/Ni/Pd, between an electro-conductive paste and solders. However, there is no adhesive metal film provided as being close contact with the resin film. The semiconductor device described in the patent document 3 has semiconductor chips mounted on both surfaces of a flexible substrate. There is, however, no diffusion barrier metal film preventing diffusion of solders provided thereto.

Unlike the patent documents 1-3, this embodiment successfully achieves a high level of adhesiveness between the adhesive metal film and the resin film, by providing the diffusion barrier metal film on both sides of the adhesive metal film as described in the above. In the semiconductor device described in the patent document 1, a possible method of improving the adhesiveness of the Cu film to the insulating base material may be roughening of the surface of the Cu film. A disadvantage may, however, arise in this case in that the formation of fine patterns becomes difficult.

Further in this embodiment, the Ni film 44 is in contact with the Ti film 62. By virtue of this configuration, the solder material composing the solders 24 is successfully prevented from reaching the interface between the Ni film 44 and the Ti film 62, even when the solder material diffuses into the Cu film 42 in the resin film 50.

The solders 24 are in contact with the electro-conductive members 40 on the surface S2. This configuration can reduce the number of process steps, as compared with the case where pads are formed on the surface S2, and the solders 24 and the electro-conductive members 40 are connected via the pads. This configuration can also reduce the area of contact between the solders 24 and the electro-conductive members 40 as compared with the case where the connection is accomplished through the pads.

As shown in this embodiment, provision of the Au film on the Ni film 66 can successfully improve the wettability to the solder 14. Similarly for the case where the Au film is provided on the Cu film 42, the wettability to the solder 24 can be improved.

The interconnects 70 contain a material composing the Ti film 62. This configuration allows simultaneous formation of a part of, or the entire portion of the interconnects 70 with the Ti film 62, so that increase in the number of process steps can be suppressed. In particular in this embodiment, the interconnects 70 have a stacked structure same as that composed of the Ti film 62, the Cu film 64 and the Ni film 66. By this configuration, increase in the number of process steps can more effectively be suppressed.

The resin film 50 can more readily be formed when the thickness thereof is 20 μm or smaller, than in the case where the thickness exceeds 20 μm. The solder material composing the solders 24, however, becomes more likely to reach the interface between the resin film 50 and the Ti film 62, as the resin film 50 becomes thinner and thinner, unless the solder is prevented from diffusing by the Ni film 44. This problem becomes more distinctive, when the thickness of the resin film 50 is 20 μm or smaller. Therefore in this case, efficacy of providing the Ni film 44 becomes particularly large.

In this embodiment, the process steps up to the placement of the semiconductor chip 10 take place on the supporting substrate 92. This configuration makes the handling easier, as compared with the case where the supporting substrate 92 is not used.

Figure 10:
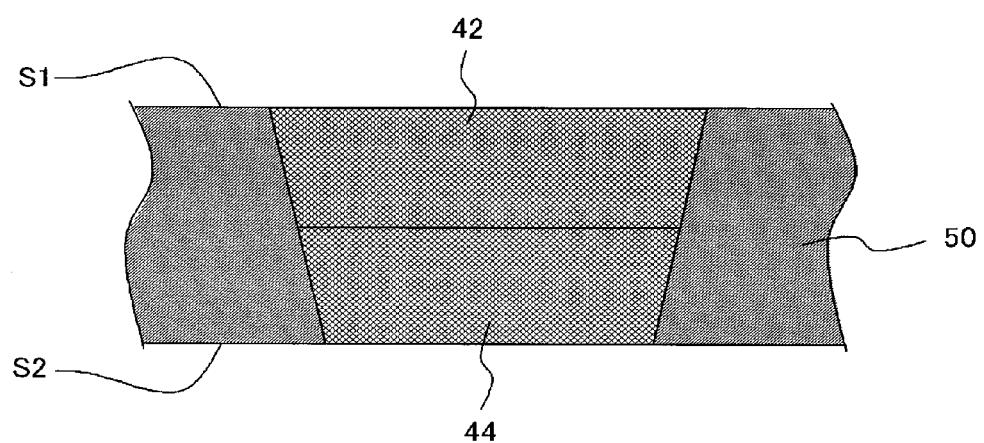
FIG. 10 is a sectional view explaining a modified example of the embodiment.
Figure 11:
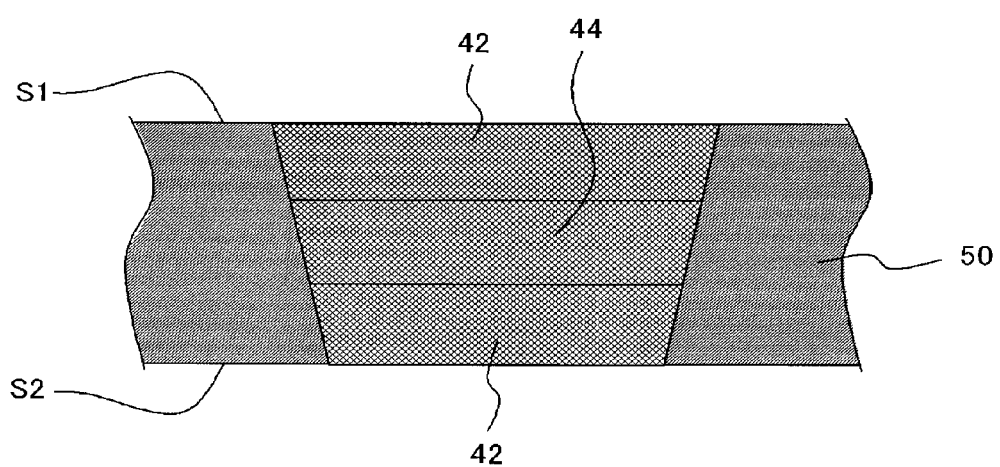
FIG. 11 is a sectional view explaining another modified example of the embodiment.

The semiconductor device and the method of manufacturing the same according to the present invention are not limited to the above described embodiment, and allow various modifications. For example, the electro-conductive member 40 may be configured by the second diffusion barrier metal film at least in a part thereof, wherein as shown in FIG. 10 the surficial layer on the surface S1 side may be configured by the Cu film 42, and the surficial layer on the surface S2 side may be configured by the Ni film 44. It is still also allowable that, as shown in FIG. 11, the surficial layers of the electro-conductive member 40 on both sides may be configured by the Cu films 42, and the Ni film 44 is provided between both Cu films 42. The entire portion of the electro-conductive member 40 may be configured by the Ni film.

The above-described embodiment showed the case where another film (Cu film 64 FIG. 2) is given between the adhesive metal film and the first diffusion barrier metal film. However, the first diffusion barrier metal film may directly be provided on the adhesive metal film. In other words, the adhesive metal film and the first diffusion barrier metal film may be in close contact with each other.

The above-described embodiment showed the case where first and second electronic circuit components are semiconductor chips. However, the first and second electronic circuit components may be interconnect substrates. It is still also allowable that either one of the first and second electronic circuit components may be a semiconductor chip, and the other may be an interconnect substrate.

The above-described embodiment showed Ti film as the adhesive metal film. However, the adhesive metal film may be a TiN film, W film, TiW film, Cr film, Ta film or TaN film. In view of practical value, Ti film is particularly preferable.

The above-described embodiment showed the Ni film as the first and second diffusion barrier metal films. However, the first and second diffusion barrier metal films may be a NiV film or the like. In view of practical value, Ni film is particularly preferable. It is not always necessary that the first and second diffusion barrier metal films are the same, but may be different films.

The above-described embodiment exemplified the resin film as the insulating film. However, the insulating film may be any insulating film other than the resin film.

The above-described embodiment exemplified the manufacturing method using the supporting substrate. However, use of the supporting substrate is not essential. In other words, the process steps (a) and (f) are omissible from the above-described process steps (a) to (g).

Figure 12:
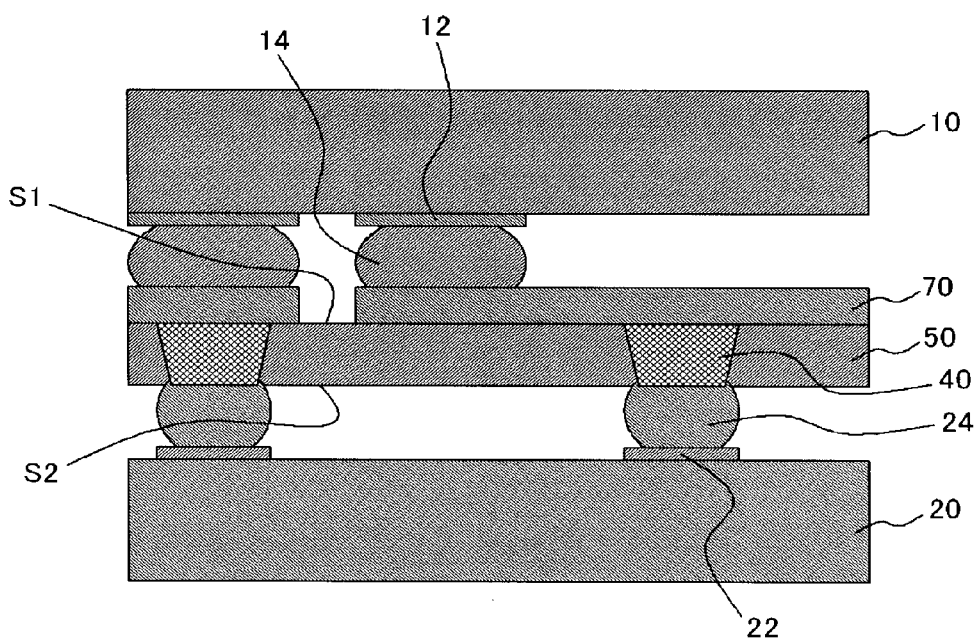
FIG. 12 is a sectional view explaining another modified example of the embodiment.
Figure 13:
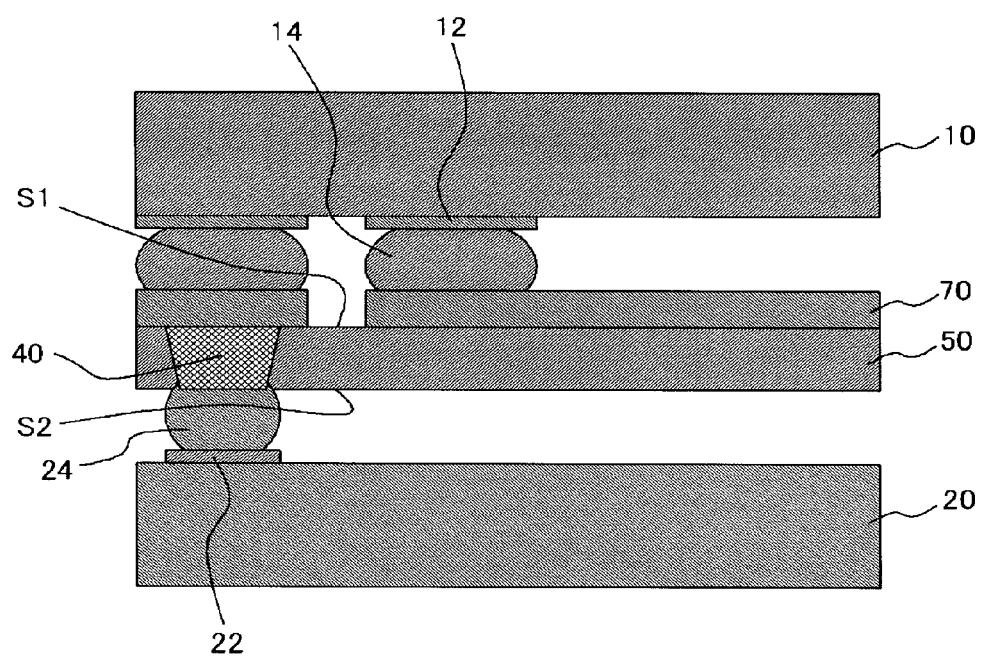
FIG. 13 is a sectional view explaining another modified example of the embodiment.
Figure 14:
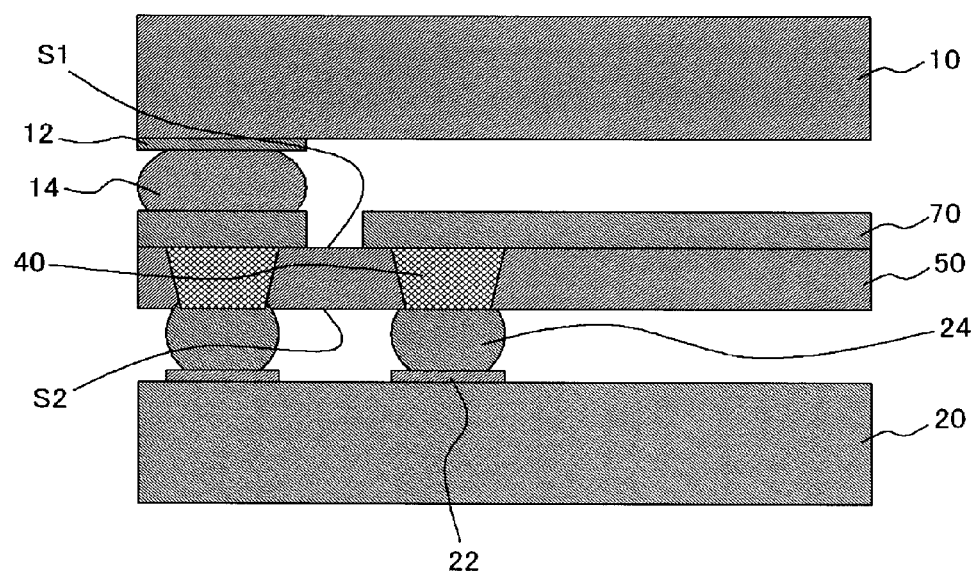
FIG. 14 is a sectional view explaining another modified example of the embodiment.
Figure 15:
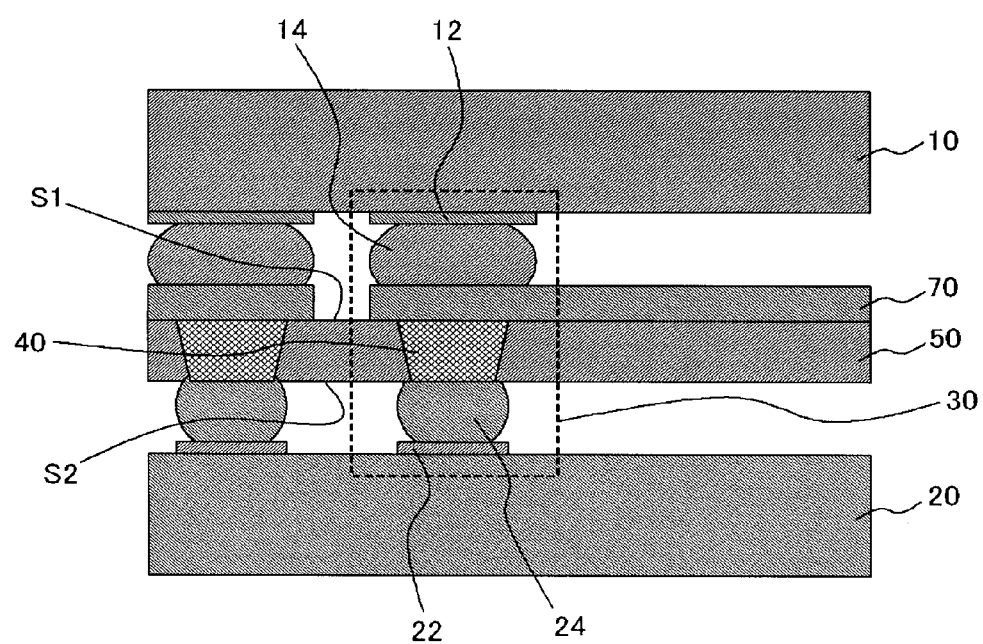
FIG. 15 is a sectional view explaining another modified example of the embodiment.

Also the arrangement of the interconnects 70 is not limited to that shown in FIG. 2, allowing various modifications. FIG. 12 shows an exemplary arrangement of the interconnects 70 in which position of the electrodes 12 of the semiconductor chip 10 and position of the electrodes 22 of the semiconductor chip 20 differ from each other. FIG. 13 shows an exemplary arrangement of the interconnects 70 in which the electrodes 12 of the semiconductor chip 10 are connected via the interconnects 70 to the external electrode terminals 90 (see FIG. 1). The right-hand end of the interconnects 70 are connected to the external electrode terminals 90. FIG. 14 shows an exemplary arrangement of the interconnects 70 in which the electrodes 22 of the semiconductor chip 20 are connected via the interconnects 70 to the external electrode terminals 90. The right-hand ends of the interconnects 70 are connected to the external electrode terminals 90. FIG. 15 shows an exemplary arrangement of the interconnects 70 in which the interconnects 70 are connected to the connective portions 30. It is to be noted that the underfill resins 84, 86 (see FIG. 2) are not shown in FIG. 12 to FIG. 15.

Figure 16:
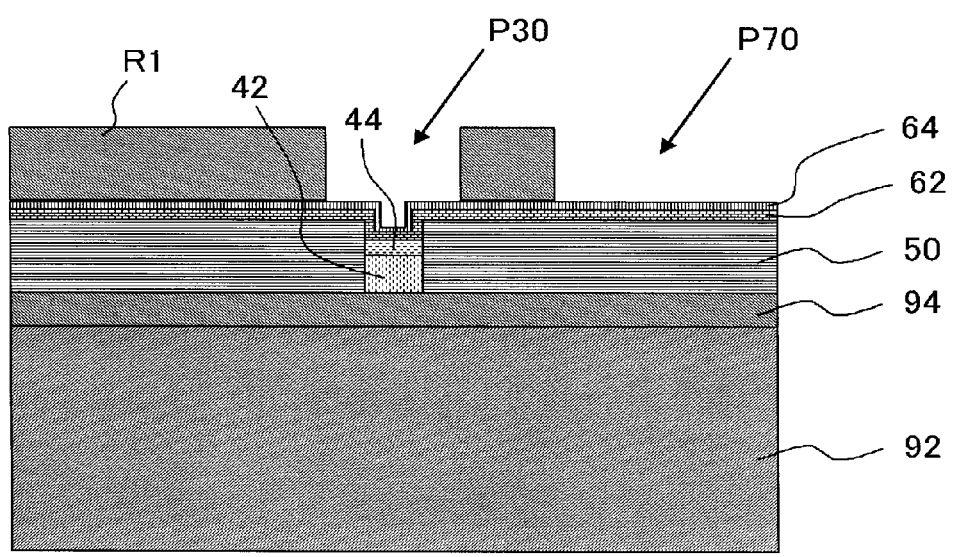
FIG. 16 is a sectional view explaining another modified example of the embodiment.

It is also allowable to form the interconnects 70 at the same time with the connective portions 30. In this case, in the step of subjecting the photoresist R1 to light exposure and development (see FIG. 5C), the photoresist R1 is removed, as shown in FIG. 16, not only in the portion P30 destined for formation of the connective portions 30, but also in the portion P70 destined for formation of the interconnects 70. The interconnect film 60 is then formed also in this portion P70, and the Cu film 64 and the Ti film 62 are etched through the interconnect film 60 used as a mask. By this process, the interconnects 70 are formed simultaneously with the connective portions 30. Other process steps are same as those explained referring to FIG. 4A to FIG. 9B.

It is apparent that the present invention is not limited to the above embodiment, and may be modified and changed without departing from the scope and spirit of the invention.

What is claimed is:

1. A semiconductor device comprising:
    an insulating film;
    an electro-conductive member provided in said insulating film;
    a first electronic circuit component provided on a first surface side of said insulating film, and electrically connected to said electro-conductive member via a first solder;
    a second electronic circuit component provided on a second surface side, which is opposite to said first surface side, of said insulating film, and electrically connected to said electro-conductive member via a second solder;
    a first diffusion barrier metal film provided between said electro-conductive member and said first solder, and preventing diffusion of said first solder;

a second diffusion barrier metal film constituting at least a part of said electro-conductive member, and preventing diffusion of said second solder; and an adhesive metal film provided on said first surface side of said insulating film and on said electro-conductive member as being brought into contact with said insulating film and said electro-conductive member, said adhesive metal film having stronger adhesiveness to said insulating film than adhesiveness of said first solder to said insulating film and adhesiveness of said first diffusion barrier metal film to said insulating film.

2. The semiconductor device as claimed in claim 1, wherein said second diffusion barrier metal film is in contact with said adhesive metal film.

3. The semiconductor device as claimed in claim 1, wherein said second solder is in contact with said electro-conductive member on said second surface of said insulating film.

4. The semiconductor device as claimed in claim 1, wherein said adhesive metal film is a Ti film, TiN film, W film, TiW film, Cr film, Ta film or TaN film.

5. The semiconductor device as claimed in claim 1, wherein each of said first and second diffusion barrier metal film is a Ni film or NiV film.

6. The semiconductor device as claimed in claim 1, further comprising a first Au film provided on said first diffusion barrier metal film, as being brought into contact with said first solder.

7. The semiconductor device as claimed in claim 1, further comprising a second Au film provided on said electro-conductive member, as being brought into contact with said second solder.

8. The semiconductor device as claimed in claim 1, further comprising an interconnect provided on said first surface of said insulating film, and including a material composing said adhesive metal film.

9. The semiconductor device as claimed in claim 1, wherein said insulating film has a thickness of 20 µm or smaller.

* * * * *